United States Patent
Khandelwal et al.

(10) Patent No.: US 9,835,683 B2
(45) Date of Patent: Dec. 5, 2017

(54) CLOCK GATING FOR X-BOUNDING TIMING EXCEPTIONS IN IC TESTING

(71) Applicant: FREESCALE SEMICONDUCTOR, INC., Austin, TX (US)

(72) Inventors: Priya Khandelwal, Noida (IN); Himanshu Arora, Noida (IN); Abhilash Kaushal, Noida (IN)

(73) Assignee: NXP USA, INC., Austin, TX (US)

( * ) Notice: Subject to any disclaimer, the term of this patent is extended or adjusted under 35 U.S.C. 154(b) by 35 days.

(21) Appl. No.: 14/973,624

(22) Filed: Dec. 17, 2015

(65) Prior Publication Data
US 2017/0176535 A1    Jun. 22, 2017

(51) Int. Cl.
*G01R 31/28* (2006.01)
*G01R 31/317* (2006.01)
*G01R 31/3177* (2006.01)

(52) U.S. Cl.
CPC ... *G01R 31/31727* (2013.01); *G01R 31/3177* (2013.01)

(58) Field of Classification Search
CPC .............. G01R 31/31727; G01R 31/3177
See application file for complete search history.

(56) References Cited

U.S. PATENT DOCUMENTS

2009/0240997 A1* 9/2009 Hasegawa ........ G01R 31/31727
                                                     714/731
2009/0327986 A1* 12/2009 Goswami ....... G01R 31/318547
                                                     716/108
2014/0258798 A1   9/2014 Ahmed et al.

OTHER PUBLICATIONS

Xinli Gu et al., "An Effort-Minimized Logic BIST Implementation Method", ITC International Test Conference, Paper 36.1, IEEE 0-7803-7169-0/01, 2001, pp. 1002-1010.
Graham Hetherington et al., "Logic BIST for Large Industrial Designs: Real Issues and Case Studies", ITC International Test Conference, Paper 142, IEEE 0-7803-5753-1/99, 1999, pp. 358-367.

* cited by examiner

*Primary Examiner* — Thien D Nguyen
(74) *Attorney, Agent, or Firm* — Charles E. Bergere

(57) ABSTRACT

An integrated circuit includes a clock gate that is used to prevent timing exception paths from affecting data being captured by scan chain registers during at-speed scan testing. A single clock gate can be used to control multiple timing-exception paths, so the amount of X-bounding circuitry inserted into the IC can be drastically reduced compared to that required by conventional X-bounding methodologies.

17 Claims, 6 Drawing Sheets

CLOCK GATING FOR X-BOUNDING TIMING EXCEPTIONS IN IC TESTING

BACKGROUND

The present disclosure relates to integrated circuit (IC) testing, and, more particularly, to logic built-in self-test (LBIST) circuitry and the like.

Built-in self-test (BIST) is a mechanism that enables a machine or system to test itself. Engineers use BIST to meet customer specifications and/or to reduce reliance upon external test equipment in making the determination of whether or not a device or circuit under test (DUT or CUT) works properly. In some cases, a BIST mechanism may be used to test device circuitry that is not otherwise accessible for testing from the device exterior. In the context of an integrated circuit, logic BIST (LBIST) is a form of BIST in which the corresponding hardware and/or software is built into the IC to enable the IC to test its own operation. A similar testing approach alternatively can be implemented using automatic test pattern generation (ATPG) instead of or in addition to LBIST.

One of the challenges in generating at-speed scan tests is to avoid false failures due to exercising paths that are not designed to propagate logic values within a single clock cycle or paths that are functionally asynchronous. These paths are known as timing-exception paths, examples of which include false paths and multi-cycle paths. False paths are not exercisable in the functional mode of operation, but may be exercisable during scan testing. Multi-cycle paths are designed such that the expected values are only available at the destination node after some specified number of clock cycles. These paths, if exercised during at-speed capture, may lead to the capture of an unknown value (often referred to in the relevant literature as an "X"), thereby corrupting the test signature(s). Current methodology in the industry tends to mask these paths from at-speed testing (e.g., using SDC: Synopsys Design Constraints). Masking these paths through SDC can be done, e.g., by X-propagation of data from the launch registers (of timing exception related paths). This however may lead to test-coverage loss, as valid paths get masked due to the X-propagation.

Techniques implemented in ICs for the purpose of controlling various types of X-propagation during LBIST/ATPG testing are generally referred to as "X-bounding". The present invention generally relates to X-bounding of timing-exception paths in at-speed scan testing.

For example, in some conventional ICs, X-bounding may be implemented by inserting one or more dedicated logic gates, flip-flops, latches, registers, multiplexers, and/or other suitable circuit elements into a respective safe-stating point corresponding to each relevant X-propagation path. However, this approach may disadvantageously lengthen critical paths, increase the die area, and/or increase the IC's power consumption. In addition, the predetermined logic outputs of the inserted safe-stating circuit elements may propagate through downstream logic, thereby limiting the effective test patterns that can be applied for testing the IC and/or reducing the percentage of the logic circuitry that can be covered by the tests.

BRIEF DESCRIPTION OF THE DRAWINGS

Embodiments of the present invention(s) are illustrated herein by way of example and are not limited by the accompanying figures, in which like references indicate similar elements. Elements in the figures are illustrated for simplicity and clarity and have not necessarily been drawn to scale. Various aspects, features, and benefits of the disclosed embodiments will become more fully apparent, by way of example, from the following detailed description that refers to the accompanying figures, in which.

DETAILED DESCRIPTION

Figure 1:
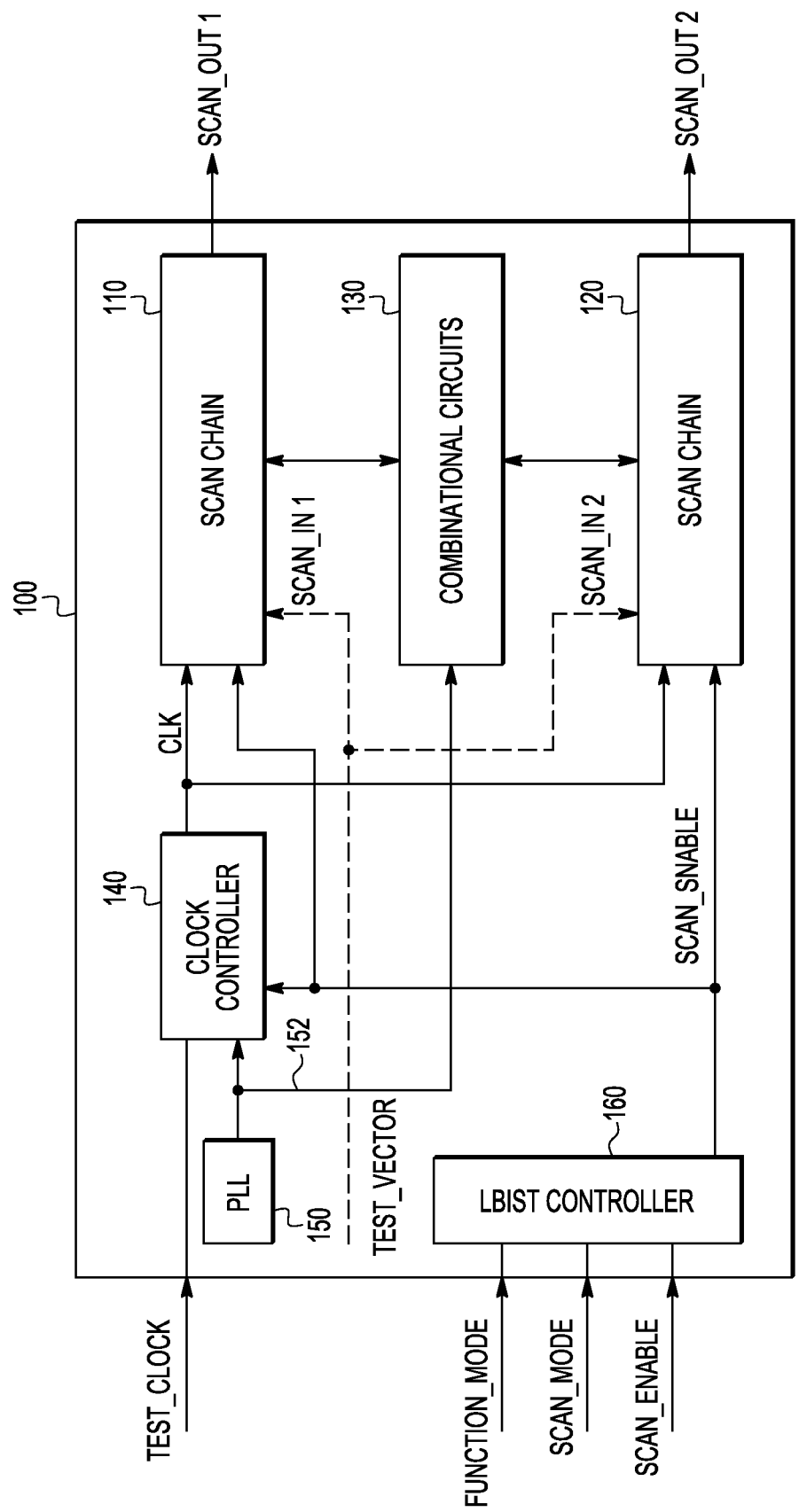
FIG. 1 is a schematic block diagram that illustrates an integrated circuit (IC) according to an embodiment of the invention.

Detailed illustrative embodiments of the present invention are disclosed herein. However, specific structural and functional details to which the disclosure refers are merely representative for purposes of describing example embodiments of the present invention(s). Embodiments of the present invention(s) may be embodied in many alternative forms and should not be construed as limited to only the embodiments set forth herein.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative embodiments, certain functions or acts may occur out of the order indicated in the figures.

As used herein, the terms "assert" and "de-assert" are used when referring to the rendering of a control signal, status bit, or other relevant functional feature or element into its logically true and logically false state, respectively. If the logically true state is a logic level one, then the logically false state is a logic level zero. Alternatively, if the logically true state is logic level zero, then the logically false state is logic level one.

In various alternative embodiments, each logic signal described herein may be generated using positive or negative logic circuitry. For example, in the case of a negative logic signal, the signal is active low, and the logically true state corresponds to a logic level zero. Alternatively, in the case of a positive logic signal, the signal is active high, and the logically true state corresponds to a logic level one.

In one embodiment, the present invention provides an IC design in which a clock gate is used to prevent timing-exception paths from affecting data being captured by the scan-chain registers during at-speed scan testing. Since a single clock gate can be used to control multiple timing-exception paths in the IC design, the amount of X-bounding circuitry inserted into the IC can be significantly reduced compared to that required by conventional X-bounding methodologies. As a result, at least some deleterious effects of the X-bounding circuitry on the IC's critical paths, die area, power consumption, and/or test coverage can beneficially be alleviated.

In one embodiment, the present invention is an IC having a plurality of registers connectable in one or more scan chains for scan-testing the IC. The registers include a first register having an output data port and a second register having an input data port. The output and input data ports are connected by way of a timing-exception path through a combinational logic circuit. A clock gate is coupled to a clock port of the first register and configured to generate a second clock signal by gating a first clock signal, where the first clock signal is applied to a clock port of the second register. In response to one or more control signals, the clock gate generates the second clock signal in a manner that causes the output data port of the first register to output a fixed logic level during a capture phase of an at-speed scan test.

In another embodiment, the present invention is a method of testing an IC. The method comprises shifting a test vector into a plurality of registers connected into a scan chain. The registers include a first register having an output data port and a second register having an input data port. The output and input data ports are connected by way of a timing-exception path through a combinational logic circuit. A first clock signal is gated to generate a second clock signal, where the first clock signal is applied to a clock port of the second register, and the second clock signal is applied to a clock port of the first register. The gating step comprises generating the second clock signal in a manner that causes the output data port of the first register to output a fixed logic level during a capture phase of an at-speed scan test.

Referring now to FIG. 1, a block diagram of an IC 100 according to an embodiment of the present invention is shown. The IC 100 is designed for scan testing and, as such, has a plurality of scan chains, only two of which, labeled 110 and 120, are shown in FIG. 1 for illustration purposes. In some embodiments, the scan chains 110 and 120 (and the other scan chains, if any) can be serially connected to one another to form a single scan chain.

As known in the pertinent art, a scan chain can be formed, e.g., by placing a multiplexer (MUX) at the input of each flip-flop in a selected subset of flip-flops in such a way that the flip-flops can be connected (i) to one another to form a serial shift register in one configuration of the MUXes and (ii) as functional elements of the logic circuitry configured to implement an intended IC function in another configuration of the MUXes. A person of ordinary skill in the art will understand that alternative scan-chain structures can also be used in the IC 100. An example alternative structure of a scan chain that can be used to implement the scan chains 110/120 in a possible embodiment is shown in more detail in FIG. 3.

The IC 100 can be reconfigured from a function mode to a scan mode by de-asserting the control signal FUNCTION_MODE and asserting the control signals SCAN_MODE and SCAN_ENABLE. With the control signals SCAN_MODE and SCAN_ENABLE being asserted, the scan chains 110 and 120 can receive data through the scan ports SCAN_IN1 and SCAN_IN2, respectively, and output data through the scan ports SCAN_OUT1 and SCAN_OUT2, respectively. Using this accessibility of flip-flops in the scan chains 110 and 120, a scan-based test of the IC 100 may be performed, for example, using the following processing steps: (i) de-asserting the control signal FUNCTION_MODE and asserting the control signals SCAN_MODE and SCAN_ENABLE; (ii) shifting into the scan chains 110 and 120, through the scan ports SCAN_IN1 and SCAN_IN2, respectively, desired test vectors; (iii) de-asserting the control signal SCAN_ENABLE; (iv) applying one or more pulses of a functional clock signal to process the test vectors using combinational logic circuits 130 connected to the scan chains' flip-flops to produce test signatures that are stored back into those flip-flops; (v) re-asserting the control signal SCAN_ENABLE; and (vi) shifting out of the scan chains 110 and 120, through the scan ports SCAN_OUT1 and SCAN_OUT2, respectively, the test signatures captured in the flip-flops of the scan chains 110 and 120.

The test vectors used in the scan-based tests can be generated, e.g., using an automatic test-pattern generator (ATPG, not explicitly shown in FIG. 1). In various embodiments, the patterns may be stored in the external automated test equipment (ATE, not explicitly shown in FIG. 1) or in an on-chip LBIST controller 160.

A clock controller 140 operates to provide a proper clock signal, labeled in FIG. 1 as CLK, to the scan chains 110 and 120 in the course of the above-described test sequence. In the embodiment shown in FIG. 1, the clock controller 140 generates the clock signal CLK using an externally generated clock signal TEST_CLOCK and a functional clock signal 152 generated in IC 100 by a phase-locked-loop (PLL) 150. In an alternative embodiment, the clock signal TEST_CLOCK can be generated internally within the IC 100. The PLL 150 is also configured to provide the functional clock signal 152 for synchronously clocking the combinational logic circuits 130 in the function mode and during the capture phase of the test mode.

Figure 2:
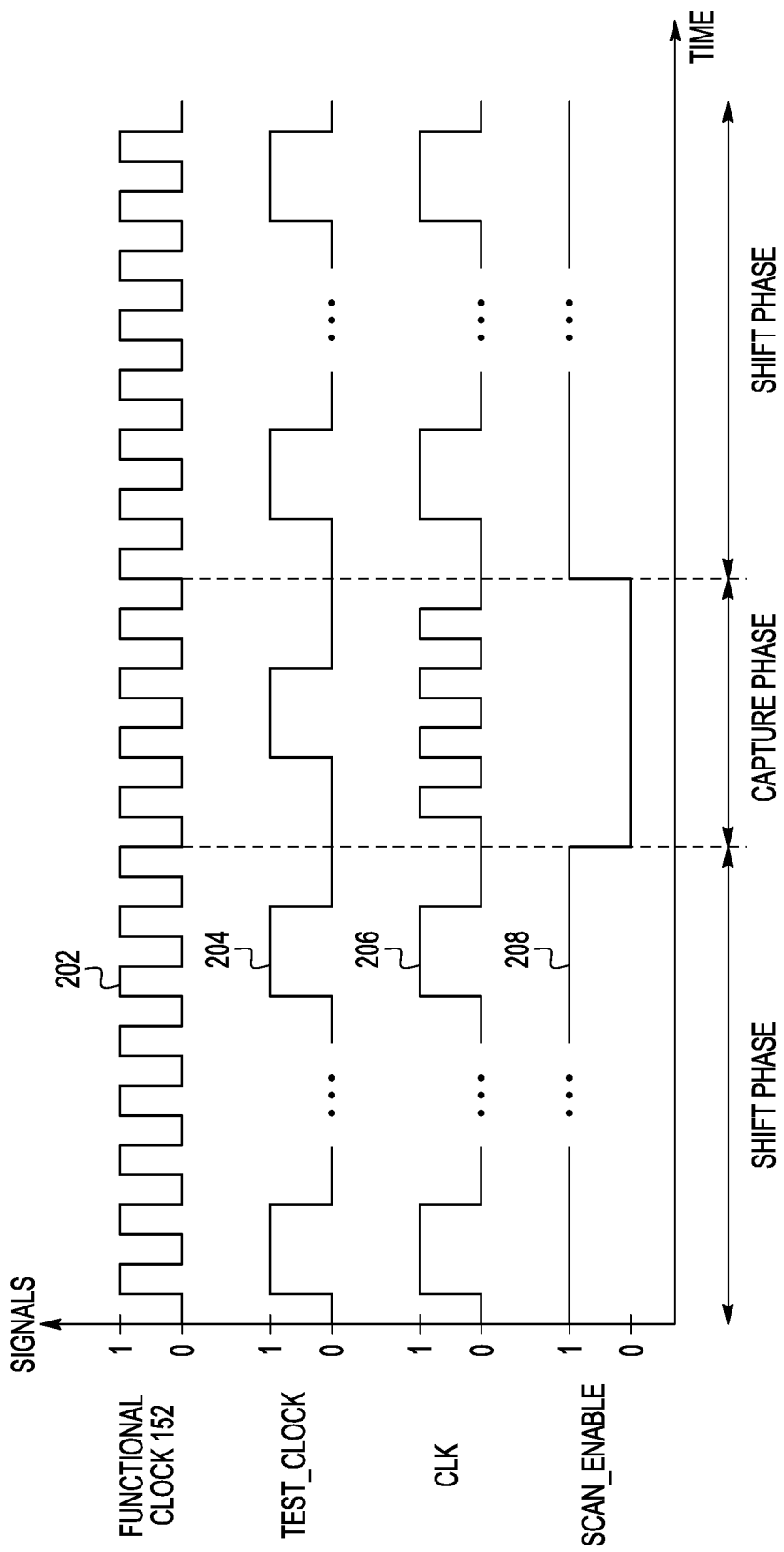
FIG. 2 is a timing diagram that graphically illustrates clock signals used in the IC of FIG. 1 according to an embodiment of the invention.

FIG. 2 is a timing diagram that further illustrates the generation of the clock signal CLK by the clock controller 140 according to an embodiment of the invention. Therein, a waveform 202 graphically shows the functional clock signal 152 generated by the PLL 150. A waveform 204 graphically shows the clock signal TEST_CLOCK. As indicated in FIG. 2, the functional clock signal 152 typically has a higher frequency than the clock signal TEST_CLOCK.

A waveform 208 graphically shows the control signal SCAN_ENABLE. As already indicated above, the control signal SCAN_ENABLE is asserted (in this case, using the logic level one) during the shift phases of the scan test, and is de-asserted (using the logic level zero) during the capture phase of the scan test.

A waveform 206 graphically shows the clock signal CLK. In an example embodiment, the clock controller 140 generates the clock signal CLK by electrically connecting to the corresponding output terminal either an electrical terminal carrying the clock signal TEST_CLOCK or an electrical terminal carrying the functional clock signal 152. For example, when the control signal SCAN_ENABLE is asserted during a shift phase of the scan test, the clock controller 140 is configured to generate the clock signal CLK by connecting the corresponding output terminal to the electrical terminal carrying the clock signal TEST_CLOCK. In contrast, when the control signal SCAN_ENABLE is de-asserted during a capture phase of the scan test, the clock controller 140 is configured to generate the clock signal CLK by connecting the corresponding output terminal to the electrical terminal carrying the functional clock signal 152.

A person of ordinary skill in the art will recognize that the clock signal CLK generated as indicated in FIG. 2 can be used for at-speed scan testing of the IC 100. At-speed scan testing is typically directed at testing the circuit-node transitions at functional frequencies to detect any possible timing-related issues in the IC, such as slow-to-rise and/or slow-to-fall faults. For this reason, a capture phase of an at-speed scan test includes two or more functional-clock pulses, e.g., as indicated in FIG. 2. In contrast, a scan test directed at detecting static (e.g., stuck-at and/or stuck-open) faults can use a single functional-clock pulse during its capture phase.

One of the challenges of at-speed scan testing is to avoid false failures of the test, e.g., due to exercising functionally asynchronous paths and/or paths that are not designed to propagate logic values within a single functional-clock cycle. Such paths are typically referred to as timing-exception paths and include but are not limited to various false paths and multi-cycle paths.

A false path is a timing arc in the design for which a change in the source register is not expected to be captured by the destination register in the function mode. While a false path is not exercisable in the function mode, it might nevertheless be exercisable in the test mode.

A multi-cycle path is a combinational path that does not have to complete signal propagation along its length within one functional-clock cycle. For example, for an N-cycle path (where N>1), the IC design is only required to ensure that a signal transition is propagated from the source node to the destination node within N functional-clock cycles.

Conventional methodology used in the industry involves masking the timing-exception paths from at-speed testing using Synopsys Design Constraints (SDC). In a separate approach, different timing-exception paths are analyzed to compile a list of safe-stating points in the design. Safe-stating logic circuits, such as OR gates, are then inserted into each of the listed safe-stating points to appropriately control, during at-speed scan testing, the X-propagation caused, e.g., by false and/or multi-cycle paths. However, as already indicated above, this insertion of numerous safe-stating logic circuits might disadvantageously lengthen critical paths, increase the required die area, increase the IC's power consumption, and/or reduce the test coverage.

In contrast, embodiments of the invention(s) disclosed herein rely on clock gates, instead of the conventional safe-stating logic circuits, to control X-propagation during at-speed scan testing. Since a single clock gate can be used to control multiple timing-exception paths in the design, the amount of additionally inserted circuitry can be drastically reduced compared to that required by the above-described conventional methodology. As a result, at least some of the above-indicated deleterious effects of the additionally inserted circuitry on the signal timing, die area, power consumption, and/or test coverage can beneficially be alleviated.

Figure 3:
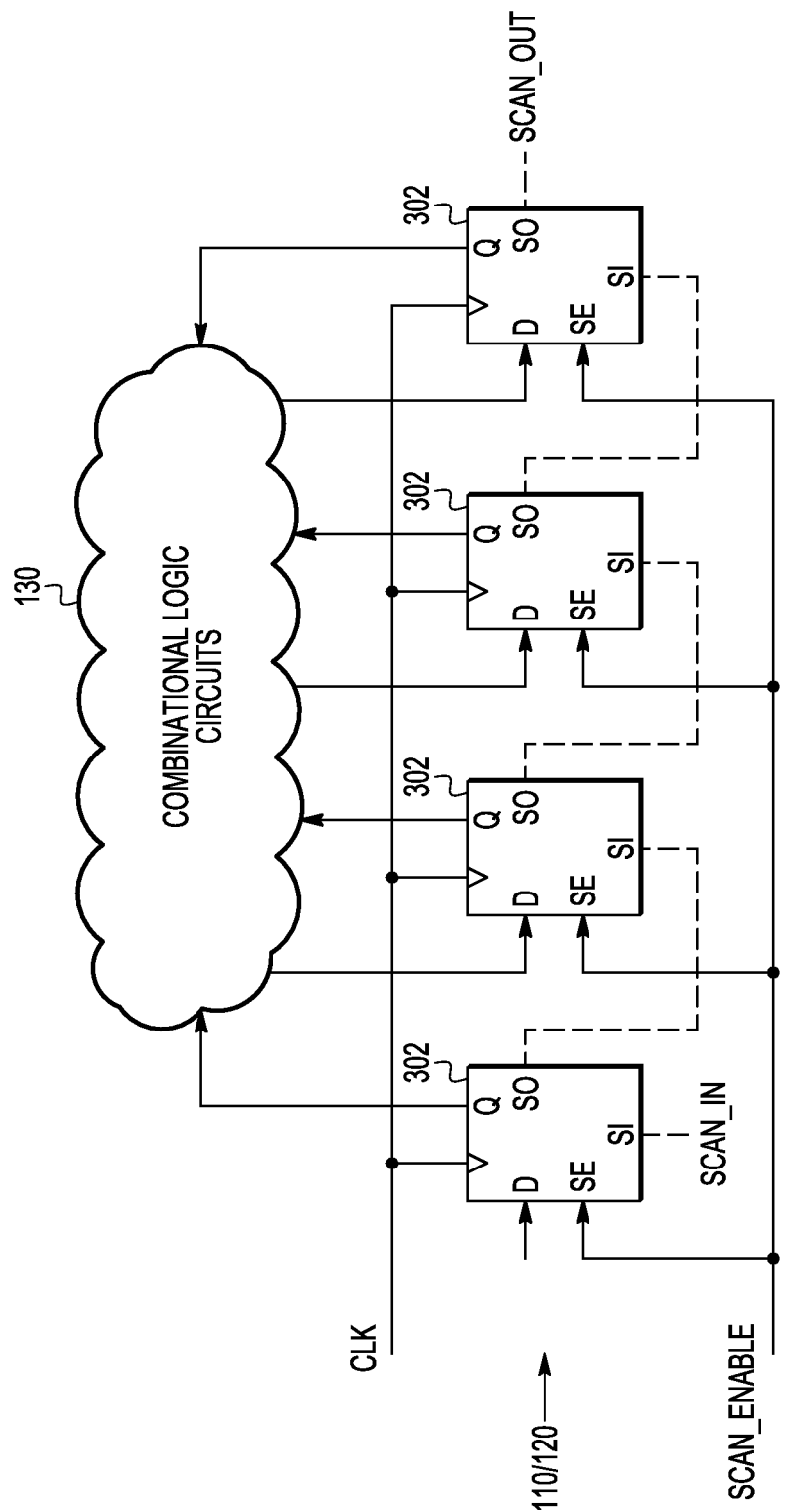
FIG. 3 is a schematic block diagram of a circuit that can be used in the IC of FIG. 1 according to an embodiment of the invention.

FIG. 3 is a block diagram of a circuit 300 that can be used in the IC 100 (FIG. 1) according to an embodiment of the invention. The circuit 300 includes a plurality of the flip-flops 302 connected to one another and to the combinational logic circuits 130 of FIG. 1 as indicated in FIG. 3. In an example embodiment, the flip-flops 302 shown in FIG. 3 implement a part of the scan chain 110 or 120.

In an example embodiment, a flip-flop 302 is a six-port device having the following ports: (i) a D port; (ii) a Q port; (iii) a scan-in port SI; (iv) a scan-out port SO; (v) a configuration-control port SE; and (vi) a clock port (indicated by the triangle). The D and Q ports are connected to the combinational logic circuits 130. The scan-out port SO of one flip-flop 302 is connected to the scan-in port SI of the next flip-flop 302 in the corresponding scan chain. The first D port and the last Q port in the shown scan chain of the flip-flops 302 can be electrically connected to other circuit elements as known in the art (these electrical connections are not explicitly shown in FIG. 3). The configuration-control port SE is typically connected to receive the control signal SCAN_ENABLE (also see FIG. 1), with some relevant exceptions further shown and explained in reference to FIG. 4. The clock port is typically connected to receive the clock signal CLK (also see FIG. 1), with some relevant exceptions also shown and explained in reference to FIG. 4.

When the control signal SCAN_ENABLE is de-asserted, the flip-flops 302 shown in FIG. 3 are configured to input and output data using the D and Q ports, respectively. When the control signal SCAN_ENABLE is asserted, the flip-flops 302 are configured to input and output data using the SI and SO ports, respectively. A person of ordinary skill in the art will understand that, in the latter configuration, the flip-flops 302 of the circuit 300 form a serial shift register.

In an example embodiment, the flip-flops 302 are positive edge-triggered flip-flops. This means that, in operation, a flip-flop 302 changes the stored logic value at a positive edge of a clock pulse applied to the clock port of the flip-flop. In an alternative embodiment, negative edge-triggered flip-flops 302 can instead be used. The subsequent description is given in reference to positive edge-triggered flip-flops 302. Based on this description, a person of ordinary skill in the art will understand, without undue experimentation, how to make appropriate modifications for an embodiment employing negative edge-triggered flip-flops.

Figure 4:
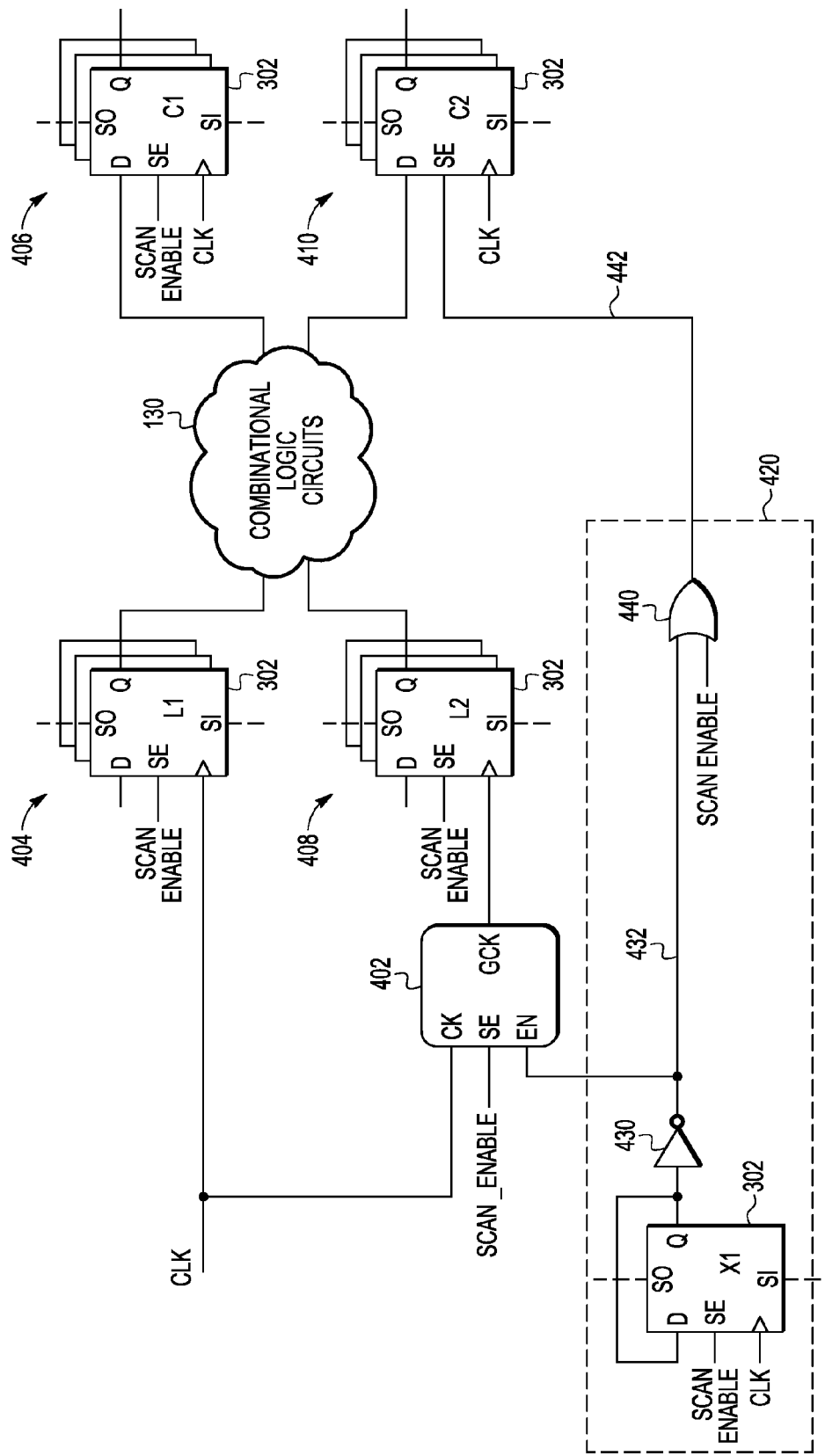
FIG. 4 is a schematic block diagram of another circuit that can be used in the IC of FIG. 1 according to an embodiment of the invention.

FIG. 4 is a block diagram of a circuit 400 that can be used in the IC 100 (FIG. 1) according to an embodiment of the invention. The circuit 400 is designed to control X-propagation using a clock gate (CG) 402 and a control circuit 420. As shown in FIG. 4, the clock gate 402 is connected to generate the signal(s) applied to the clock ports of the flip-flops 302 in a flip-flop set 408 by controllably gating the above-described clock signal CLK (also see FIG. 2). As further explained below, the flip-flop set 408 includes the flip-flops 302 of FIG. 3 that operate, during a scan test, as launch registers for the timing-exception paths in the corresponding CUT partition of the IC 100.

The circuit 400 further includes the flip-flop sets 404, 406, and 410, each of which comprises a different instance of the flip-flops 302 of FIG. 3. The flip-flops 302 in the flip-flop set 404 operate, during a scan test, as launch registers for the regular data paths (i.e., data paths without timing exceptions). The flip-flops 302 in the flip-flop set 406 operate, during a scan test, as capture registers for the regular data paths. The flip-flops 302 in the flip-flop set 410 are the flip-flops that can in principle receive data, during a scan test, through the timing-exception paths. In contrast to the flip-flops 302 in the flip-flop set 408, the flip-flops 302 in the flip-flop sets 404, 406, and 410 are all clocked using the (non-gated) clock signal CLK.

Operation of the flip-flops 302 in the flip-flop sets 404, 406, 408, and 410 during a scan test is described in more detail below using an example of the flip-flops 302 labeled in FIG. 4 as L1, L2, C1, and C2. The flip-flops L1, L2, C1, and C2 are part of the scan chains 110/120 (also see FIG. 3) and can interact through the combinational logic circuits 130. More specifically, the flip-flop pairs L1-C1, L1-C2, and L2-C1 are subject to valid single-cycle interactions. In contrast, the flip-flop pair L2-C2 is subject to at least one interaction that involves a timing-exception path. If the latter interaction is not excluded from affecting the data captured during at-speed scan testing, then it can corrupt the test signature, which can potentially cause the corresponding copy of the IC 100 to be mistakenly discarded as being defective. To avoid this outcome, the circuit 400 employs the clock gate 402 and the control logic circuit 420, e.g., as further described below, to prevent the L2-C2 interaction from affecting the data that are being captured by the flip-flops 302 during at-speed scan testing. In an example embodiment, the control logic circuit 420 includes a flip-flop X1, an inverter 430, and an OR gate 440. A person of ordinary skill in the art will understand that alternative embodiments of the control logic circuit 420 are also possible.

The flip-flop X1 is hereafter referred to as the "X-bound" flip-flop because a logic value stored in this flip-flop controls the X-bounding implemented in the circuit 400. In an example embodiment, the X-bound flip-flop X1 is part of the scan chains 110/120 and, as such, can be implemented using a flip-flop 302. In an alternative embodiment, the X-bound flip-flop X1 can be a dedicated control element that does not belong to the scan chains 110/120.

The input port of the inverter 430 is connected to the D and Q ports of the X-bound flip-flop X1 as indicated in FIG. 4. The output port of the inverter 430 is connected to the control port EN of the clock gate 402 and to the OR gate 440. The output port of the OR gate 440 is connected to the configuration-control port SE of the flip-flop C2 (and to the configuration-control ports SE of the other flip-flops 302 in the flip-flop set 410).

The clock gate (CG) 402 operates to gate the clock signal CLK (also see FIG. 2) under the control of the control signals applied to its control ports EN and SE. In the shown embodiment, the control port EN of the clock gate 402 receives a control signal 432 generated by the inverter 430. The control port SE of the clock gate 402 receives the control signal SCAN_ENABLE.

Depending on the logic levels of the received control signals 432 and SCAN_ENABLE, the clock gate 402 can cause its output port GCK to output (i) the signal received at the input port CK or (ii) the logic level zero. For example, the clock gate 402 is transparent to the clock signal CLK applied to the input port CK (i.e., the output port GCK is configured to output the clock signal CLK) when either the control signal 432 or the control signal SCAN_ENABLE (or both) is (are) at the logic level one. On the other hand, the clock gate 402 becomes opaque and outputs the logic level zero when both the control signal 432 and the control signal SCAN_ENABLE are at the logic level zero.

In addition to the control signal 432 applied to the clock gate 402, the control logic circuit 420 generates a control signal 442 applied to the configuration-control port SE of the flip-flop C2 (and also to the configuration-control ports SE of the other flip-flops 302 of the flip-flop set 410). More specifically, the OR gate 440 of the control logic circuit 420 generates the control signal 442 based on the control signals 432 and SCAN_ENABLE. The logic level of the control signal 432 depends on the logic value stored in the X-bound flip-flop X1 and is (i) at the logic level zero when the X-bound flip-flop X1 has a logic value one, and (ii) at the logic level one when the X-bound flip-flop X1 has a logic value zero.

Using the above-described characteristics of the clock gate 402 and the control logic circuit 420, an at-speed scan test of the combinational logic circuits 130 can be carried out in the circuit 400, e.g., using two sub-tests. More specifically, the first of the two sub-tests can be configured to test the combinational logic circuits 130 for functions that involve interactions of the launch and capture flip-flops 302 within the flip-flop pairs L1-C1 and L2-C1. This sub-test is further graphically illustrated by FIG. 5. The second of the two sub-tests can then be configured to test the combinational logic circuits 130 for functions that involve interactions of the flip-flops L1 and C2. This sub-test is further graphically illustrated by FIG. 6. For both of these two sub-tests, a possible interaction (through the corresponding timing-exception paths) between the flip-flops L2 and C2 is in effect blocked off, e.g., as further explained below.

Figure 5:
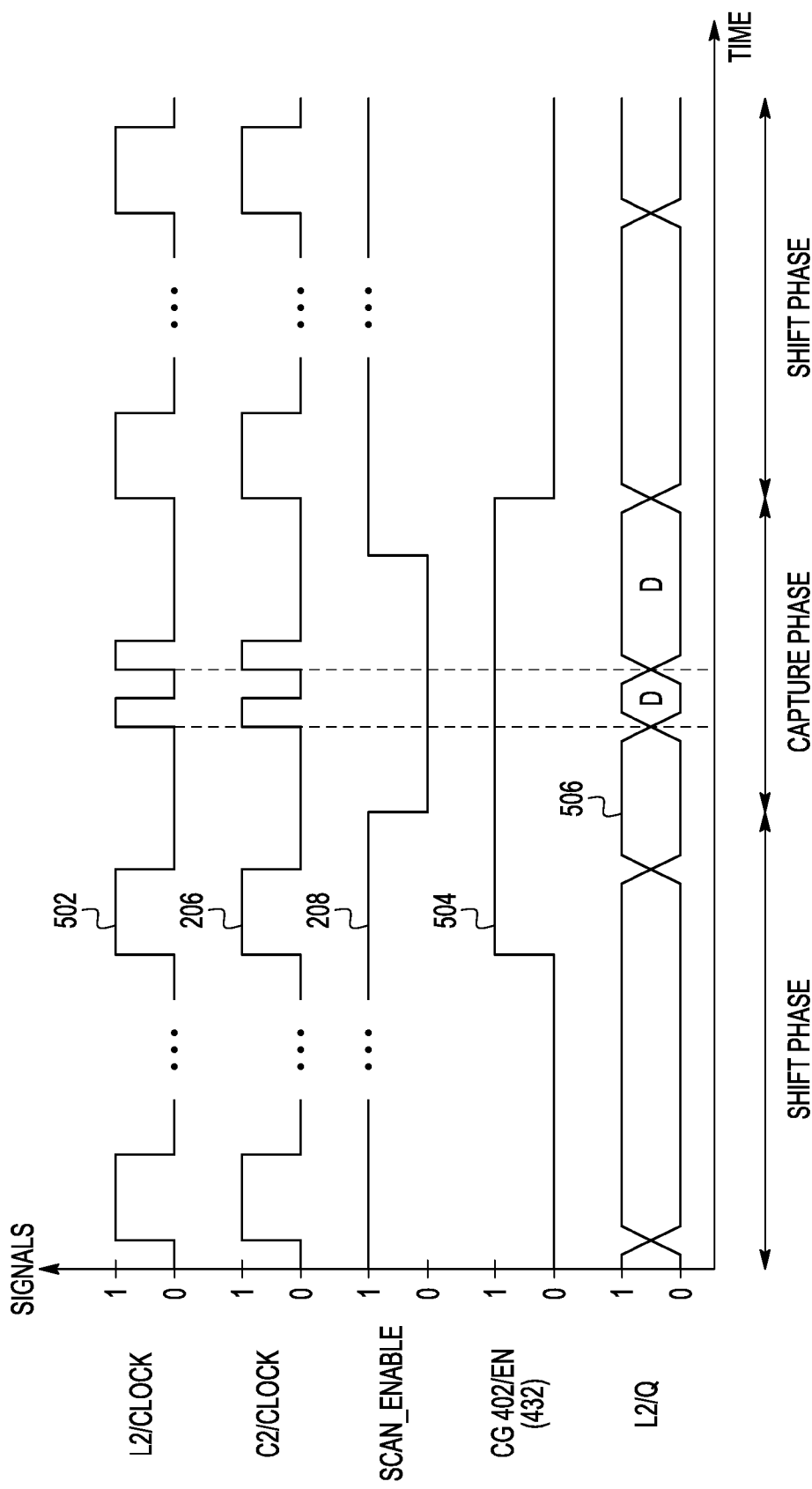
FIGS. 5 and 6 are timing diagrams that graphically illustrate various signals that can be generated in the circuit of FIG. 4 according to an embodiment of the invention.
Figure 6:
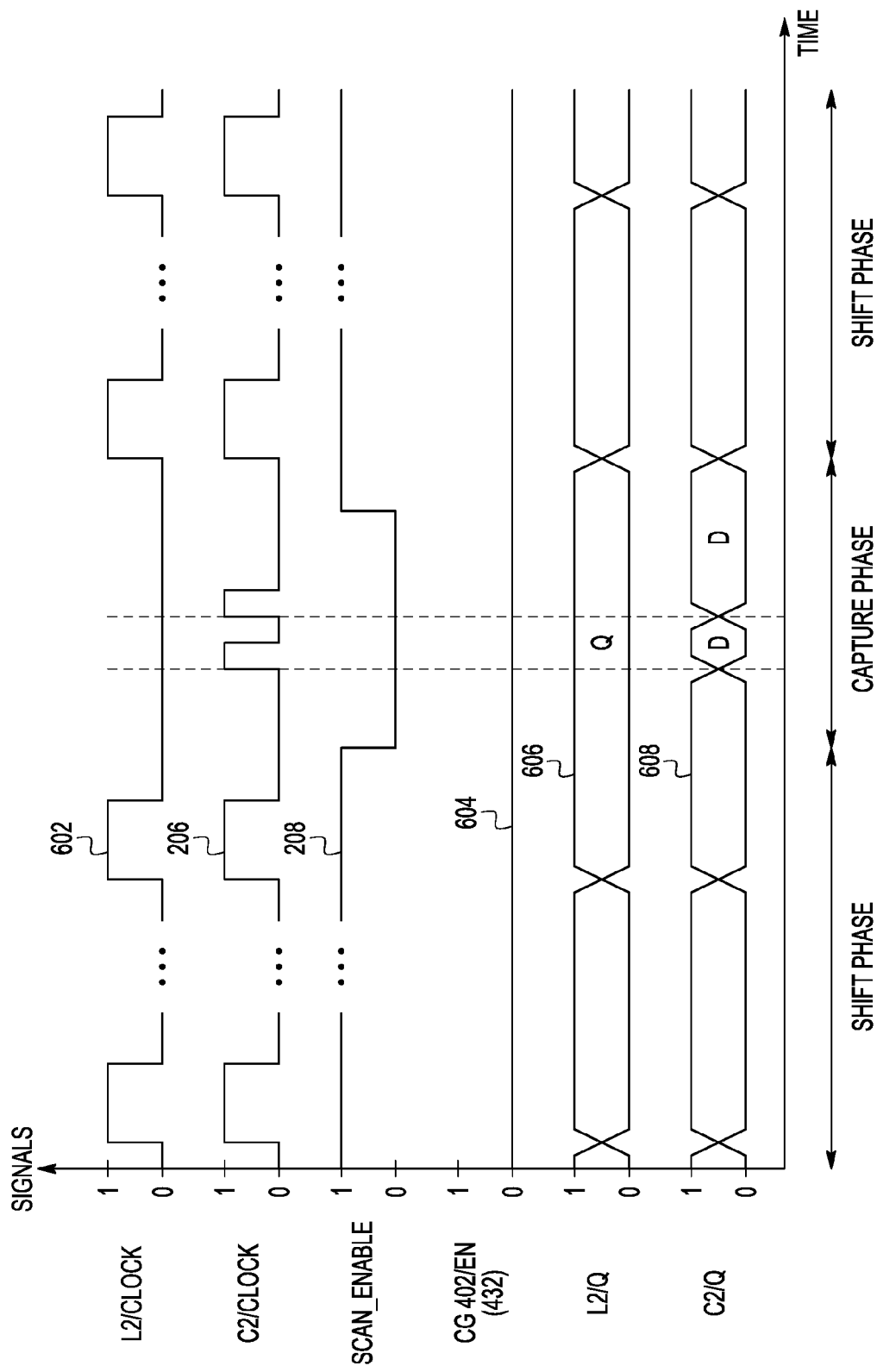

FIGS. 5 and 6 are timing diagrams that graphically illustrate various electrical signals that can be generated in the circuit 400 (FIG. 4) according to an embodiment of the invention. More specifically, FIG. 5 is the timing diagram corresponding to a configuration in which the X-bound flip-flop X1 has a logic value zero during the capture phase of an at-speed scan test. FIG. 6 is the timing diagram corresponding to a configuration in which the X-bound flip-flop X1 has a logic value one during the capture phase of an at-speed scan test. The following description of at-speed scan testing of the circuit 400 is given in reference to the circuit diagram shown in FIG. 4 and the timing diagrams shown in FIGS. 5-6.

As already explained above, the control signal SCAN_ENABLE is asserted for the shift phases of the scan test, and is de-asserted for the capture phase of the scan test, e.g., as indicated in FIGS. 5 and 6 by the waveform 208 (also shown in FIG. 2).

For the first of the above-mentioned sub-tests, a logic value zero is shifted into the X-bound flip-flop X1 before the corresponding capture phase. This logic zero causes the control signal 432 to become asserted, e.g., as indicated by a waveform 504 in FIG. 5. The assertion of the control signal 432 in turn causes the clock gate 402 to become transparent to the clock signal CLK during the capture phase. As a result, two or more functional-clock pulses are applied to the clock port of the flip-flop L2 during the capture phase, e.g., as indicated by a waveform 502 in FIG. 5. This application of the functional-clock pulses causes the flip-flop L2 to launch data into the combinational logic circuits 130, e.g., as indicated by a waveform 506 in FIG. 5. The flip-flop L1 (FIG. 4) launches data into the combinational logic circuits 130 in a similar manner. The data launched by the flip-flops L1 and L2 then propagate through the combinational logic circuits 130 towards the flip-flops C1 and C2.

The flip-flop C1 captures data corresponding to the launched data in a conventional manner. In contrast, the flip-flop C2 does not capture any data in this configuration because the control signal 442 applied to the configuration-control port SE of the flip-flop C2 during the capture phase is asserted. More specifically, the control signal 442 is asserted during the capture phase because the control signal 432 is asserted as indicated by the waveform 504. As a result, the first sub-test can test the combinational logic circuits 130 for functions that involve interactions within the flip-flop pairs L1-C1 and L2-C1, while preventing the flip-flop C2 from capturing any data during the capture phase and thereby avoiding potential corruption of the test signature.

For the second of the above-mentioned sub-tests, a logic value one is shifted into the X-bound flip-flop X1. This logic one causes the control signal 432 to be de-asserted, e.g., as indicated by a waveform 604 in FIG. 6. This de-assertion of the control signal 432 in turn causes the clock gate 402 to become opaque to the clock signal CLK during the capture phase. As a result, the logic level zero is applied to the clock port of the flip-flop L2 during the capture phase, e.g., as indicated by a waveform 602 in FIG. 6. The resulting absence of functional-clock pulses during the capture phase causes the flip-flop L2 not to launch varying data into the combinational logic circuit 130 and instead output a fixed logic level at the Q port, e.g., as indicated by a waveform 606 in FIG. 6, thereby safe-stating the flip-flop L2. At the same time, the flip-flop L1 launches data during the capture phase in a conventional manner. The data launched by the flip-flop L1 propagate through the combinational logic circuits 130 towards the flip-flops C1 and C2.

The flip-flop C1 captures data corresponding to the launched data in a conventional manner. The flip-flop C2 also captures data corresponding to the launched data, e.g., as indicated by a waveform 608, because the control signal 442 applied to the configuration-control port SE of the flip-flop C2 during the capture phase is de-asserted. More specifically, the control signal 442 is de-asserted during the capture phase because both the control signal 432 and the control signal SCAN_ENABLE are de-asserted as indicated in FIG. 6 by the waveforms 604 and 208, respectively. In this manner, the second sub-test can test the combinational logic circuits 130 for functions that involve interactions of the flip-flops L1 and C2, and additionally test the combinational logic circuits 130 for functions that involve interactions of the flip-flops L1 and C1. Since the flip-flop L2 is safe-stated during the second sub-test, the corresponding timing-exception paths are prevented from causing the test signature to be corrupted.

Although the present invention has been described in the context of scan chains implemented using flip-flops, those skilled in the art will understand that other types of registers, such as (without limitation) latches, may be used.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected by way of a conductor for the transferred energy.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. An integrated circuit (IC) operable in a scan test mode that includes a shift phase and a capture phase, the IC comprising:
   a combinational logic circuit having a plurality of regular paths and at least one timing exception path;
   a plurality of registers connected in one or more scan chains for scan testing the IC, the plurality of registers including a first register having an output data port and a second register having an input data port, wherein the output data port of the first register and the input data port of the second register are connected by way of the at least one timing exception path of the combinational logic circuit; and
   a clock gate coupled to a clock port of the first register, wherein the clock gate receives one or more control signals and a first clock signal, and generates a second clock signal by gating the first clock signal, wherein the first clock signal is applied to a clock port of the second register and the second clock signal is applied to the clock port of the first register; and
   wherein, in response to the one or more control signals, the clock gate generates the second clock signal in a manner that causes the output data port of the first register to output a fixed logic level during the capture phase of an at-speed scan test when the IC is in the scan test mode.

2. The integrated circuit of claim 1, further comprising a control logic circuit that generates a first of the one or more control signals, and an additional control signal that is applied to a scan enable port of the second register, wherein the additional control signal is different from the first control signal of the one or more control signals.

3. The integrated circuit of claim 2, wherein, in response to the one or more control signals, the clock gate generates the second clock signal in one of a first configuration and a second configuration different from the first configuration.

4. The integrated circuit of claim 3, wherein:
   in the first configuration of the clock gate, the second clock signal is the same as the first clock signal; and
   in the second configuration of the clock gate, the second clock signal is at a fixed logic level regardless of the first clock signal.

5. The integrated circuit of claim 2, wherein the control logic circuit receives a scan enable control signal and generates the additional control signal based on (i) the first of the one or more control signals and (ii) the scan enable control signal.

6. The integrated circuit of claim 5, wherein the one or more control signals further include a second control signal that is the scan enable control signal.

7. The integrated circuit of claim 5, wherein:
   the plurality of registers further comprises a third register having an output data port connected to the input data port of the second register by way of one of the regular paths of the combinational logic circuit; and
   a configuration control port of the third register is connected to receive the scan enable control signal.

8. The integrated circuit of claim 5, wherein:
   the plurality of registers further comprises a third register having an input data port;
   the output data port of the first register is connected to the input data port of the third register by way of one of the regular paths of the combinational logic circuit; and
   a configuration control port of the third register is connected to receive the scan enable control signal.

9. The integrated circuit of claim 8, wherein:
the plurality of registers further comprises a fourth register having an output data port connected to the input data port of the second register by way of another regular path of the plurality of regular paths of the combinational logic circuit; and
a configuration control port of the fourth register is connected to receive the scan enable control signal.

10. The integrated circuit of claim 2, wherein the control logic circuit comprises:
an X-bound register having an input data port connected to an output data port thereof, a scan enable port that receives a scan enable control signal, and a clock port that receives the first clock signal, wherein the first control signal of the one or more control signals is generated by the X-bound register; and
a logic gate having a first input connected to the output data port of the X-bound register, a second input that receives the scan enable control signal, and an output that provides the additional control signal.

11. The integrated circuit of claim 2, wherein the control logic circuit is connected to and applies the additional control signal to respective scan enable ports of an additional one or more registers of the plurality of registers.

12. The integrated circuit of claim 1, wherein the clock gate applies the second clock signal to respective clock ports of an additional one or more registers of the plurality of registers.

13. The integrated circuit of claim 1, wherein:
the plurality of registers further comprises a third register having an output data port connected to the input data port of the second register by way of one of the regular paths of the plurality of regular paths of the combinational logic circuit; and
a clock port of the third register is connected to receive the first clock signal.

14. The integrated circuit of claim 1, wherein:
the plurality of registers further comprises a third register having an input data port connected to the output data port of the first register by way of one of the regular paths of the plurality of regular paths of the combinational logic circuit; and
a clock port of the third register is connected to receive the first clock signal.

15. The integrated circuit of claim 14, wherein:
the plurality of registers further comprises a fourth register having an output data port connected to the input data port of the second register by way of another regular path of the plurality of regular paths of the combinational logic circuit; and
a clock port of the fourth register is connected to receive the first clock signal.

16. An integrated circuit (IC) operable in a scan test mode that includes a shift phase and a capture phase, the IC comprising:
a combinational logic circuit having a plurality of regular paths and at least one timing exception path;
a control circuit that receives a first clock signal and a scan enable signal, and generates first and second control signals;
a clock gate that receives the first clock signal, the scan enable signal, and the first control signal, and generates a second clock signal; and
a plurality of registers connected in one or more scan chains for scan testing the IC when the IC is in the scan test mode, the plurality of registers including:
a first register having a scan enable port that receives the scan enable signal, a clock port that receives the second clock signal, and an output data port,
a second register having an input data port connected to the output data port of the first register by way of the at least one timing exception path of the combinational logic circuit, a scan enable port connected to the control circuit and receiving the second control signal, and a clock port that receives the first clock signal,
a third register a scan enable port that receives the scan enable signal, a clock port that receives the first clock signal, and an output data port, and
a fourth register having an input data port connected to the output data port of the third register by way of one of the regular paths of the plurality of regular paths of the combinational logic circuit, a scan enable port that receives the scan enable signal, and a clock port that receives the first clock signal,
wherein, in response to the first and second control signals, the clock gate generates the second clock signal, wherein the second clock signal causes the output data port of the first register to output a fixed logic level during the capture phase of an at-speed scan test when the IC is in the scan test mode.

17. The IC of claim 16, wherein the control circuit comprises:
an x-bound register having a scan enable port that receives the scan enable signal, a clock port that receives the first clock signal, a data input port, and a data output port connected to the data input port;
an inverter having an input connected to the data output port of the x-bound register, wherein the first control signal is provided at an output of the inverter; and
a logic gate having a first input connected to an output of the inverter, a second input that receives the scan enable signal, and an output that provides the second control signal to the second register.

* * * * *